(12) United States Patent
Elkins et al.

(10) Patent No.: US 10,673,438 B1
(45) Date of Patent: Jun. 2, 2020

(54) DIGITAL SIGNAL PROCESSING BLOCK

(71) Applicant: Xilinx, Inc., San Jose, CA (US)

(72) Inventors: Adam Elkins, San Jose, CA (US);
Ephrem C. Wu, San Mateo, CA (US);
John M. Thendean, Pleasanton, CA
(US); Adnan Pratama, San Jose, CA
(US); Yashodhara Parulkar, Santa
Clara, CA (US); Xiaoqian Zhang, San
Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/373,524

(22) Filed: Apr. 2, 2019

(51) Int. Cl.
| | | |
|---|---|---|
| *G06F 7/38* | (2006.01) |
| *H03K 19/173* | (2006.01) |
| *H03K 19/17724* | (2020.01) |
| *G06F 7/575* | (2006.01) |
| *H03K 19/1776* | (2020.01) |
| *G06F 7/501* | (2006.01) |
| *G06F 7/523* | (2006.01) |
| *G06F 7/48* | (2006.01) |

(52) U.S. Cl.
CPC ..... *H03K 19/17724* (2013.01); *G06F 7/4812* (2013.01); *G06F 7/501* (2013.01); *G06F 7/523* (2013.01); *G06F 7/575* (2013.01); *H03K 19/1776* (2013.01)

(58) Field of Classification Search
None
See application file for complete search history.

(56) References Cited

U.S. PATENT DOCUMENTS

| | | |
|---|---|---|
| 6,788,738 B1 | 9/2004 | New |
| 7,467,175 B2 | 12/2008 | Simkins et al. |
| 7,472,155 B2 | 12/2008 | Simkins et al. |
| 7,567,997 B2 | 7/2009 | Simkins et al. |
| 7,853,632 B2 | 12/2010 | Ching et al. |

(Continued)

OTHER PUBLICATIONS

Berkeley Design Technology, Inc., Altera's FPGA Floating-Point DSP Design Flow, Berkeley Design Technology, Inc., WP-01166-1.0, Sep. 2011, pp. 1-10.

(Continued)

*Primary Examiner* — Anh Q Tran
(74) *Attorney, Agent, or Firm* — Patterson + Sheridan, LLP (57) ABSTRACT

A digital signal processor (DSP) slice is disclosed. The DSP slice includes an input stage to receive a plurality of input signals, a pre-adder coupled to the input stage and configured to perform one or more operations on one or more of the plurality of input signals, and a multiplier coupled to the input stage and the pre-adder and configured to perform one or more multiplication operations on one or more of the plurality of input signals or the output of the pre-adder. The DSP slice further includes an arithmetic logic unit (ALU) coupled to the input stage, the pre-adder, and the multiplier. The ALU is configured to perform one or more mathematical or logical operations on one or more of the plurality of input signals, the output of the pre-adder, or the output of the multiplier. The DSP slice also includes an output stage coupled to the ALU, the output stage configured to generate one or more output signals based at least in part on one or more of the outputs of the ALU, or at least one of the plurality of input signals.

16 Claims, 7 Drawing Sheets

(56) References Cited

U.S. PATENT DOCUMENTS

| | | | |
|---|---|---|---|
| 7,870,182 B2 | 1/2011 | Thendean et al. | |
| 8,250,342 B1 | 8/2012 | Kostarnov et al. | |
| 8,495,122 B2 | 7/2013 | Simkins et al. | |
| 9,081,634 B1 | 7/2015 | Simkins et al. | |
| 10,114,917 B1 * | 10/2018 | Venkataramani | ... G06F 17/5054 |
| 2017/0322769 A1 * | 11/2017 | Langhammer | .......... G06F 5/012 |

OTHER PUBLICATIONS

Harris et al, New Pascal GPUs Accelerate Inference in the Data Center, NVIDIA Developer Blog, 2016, pp. 1-7.

* cited by examiner

DIGITAL SIGNAL PROCESSING BLOCK

TECHNICAL FIELD

Aspects of the present disclosure relate generally to electronic circuits, and more particularly to digital signal processing blocks.

BACKGROUND

Programmable logic devices (PLDs) are a well-known type of integrated circuit that can be programmed to perform specified logic functions. One type of PLD, the field-programmable gate array or FPGA, typically includes an array of programmable tiles. These programmable tiles may include, for example, input/output blocks (IOBs), configurable logic blocks (CLBs), dedicated random access memory blocks (BRAMs), multipliers, digital signal processing blocks (DSPs), processors, clock managers, delay locked loops (DLLs), and so on.

Each programmable tile may include both programmable interconnect and programmable logic. The programmable interconnect may include a large number of interconnect lines of varying lengths interconnected by programmable interconnect points (PIPs). The programmable logic may implement the logic of a user design using programmable elements that may include for example, function generators, registers, arithmetic logic, and so forth.

The programmable interconnect and programmable logic are typically programmed by loading a stream of configuration data into internal configuration memory cells that define how the programmable elements are configured. The configuration data can be read from memory such as from an external PROM or written into the FPGA by an external device. The collective states of the individual memory cells then determine the function of the FPGA.

Another type of PLD is the Complex Programmable Logic Device, or CPLD. A CPLD may include two or more "function blocks" connected together and to input/output (I/O) resources by an interconnect switch matrix. Each function block of the CPLD may include a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Performance of a design instantiated in programmable logic of an FPGA (FPGA fabric) is limited by the speed of the FPGA fabric. However, dedicated circuit resources, such as DSPs in an FPGA, are capable of performing operations faster than equivalent circuits implemented in FPGA fabric. Accordingly, it would be desirable and useful to provide means for expanding the usefulness of such DSPs.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to a digital signal processor (DSP) slice configured to operate in each of a plurality of numerical modes. The DSP slice may include an input stage to receive a plurality of input signals, a pre-adder coupled to the input stage, the pre-adder configured to perform one or more operations on one or more of the plurality of input signals. The DSP slice may further include a multiplier, coupled to the input stage and the pre-adder, configured to perform one or more multiplication operations on one or more of the plurality of input signals or the output of the pre-adder. The DSP slice may further include an arithmetic logic unit (ALU) coupled to the input stage, the pre-adder, and the multiplier, the ALU configured to perform one or more mathematical or logical operations on one or more of the plurality of input signals, the output of the pre-adder, or the output of the multiplier. The DSP slice may also include an output stage coupled to the ALU, the output stage configured to generate one or more output signals based at least in part on one or more of the outputs of the ALU, or at least one of the plurality of input signals.

In another example, a method for selectably operating a DSP slice in one of a plurality of numerical modes is disclosed. The method may include receiving one or more input signals to the DSP slice, receiving one or more control signals for the DSP slice, configuring the DSP slice to operate in a selected one of the plurality of numerical modes based at least in part on the one or more control signals, and performing one or more arithmetic or logic operations on the one or more input signals, the one or more arithmetic or logic operations based at least in part on the selected one of the plurality of numerical modes.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Aspects of the present disclosure may provide a digital signal processor (DSP) block providing a plurality of numerical modes. Such DSP blocks may more efficiency allocate resources, such as programmable logic (PL) fabric resources, by reducing the need for multiple DSPs in order to support operations using each of the plurality of numerical modes. For example, DSPs which may operate in only a single numerical mode may be less efficient when operating on data smaller than their native numerical mode. Similarly, operations on complex numerical values may be performed using a plurality of DSPs, which is inefficient compared to performing such operations in a single DSP block. More generally, enabling more operations to be performed using a single DSP slice may improve processing speed by reducing additional fabric logic and routing otherwise required for such operations. These and further aspects are described below with respect to the drawings.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

As demands for increased operating speeds increase, adding functionality in the form of configurable or programmable functionality in system on chip (SoC) devices, field-programmable gate array (FPGA) devices, or other integrated circuits (ICs) is increased. One area for increased speed of operation is digital signal processing. Described below is a digital signal processing slice that may be replicated and have multiple instances in an IC. Such digital signal processing slices may for example be grouped in a column, where output of one such slice may be an input to an adjacent slice. The following slices may include: a pre-adder; a multiplier; and an arithmetic logic unit (ALU). Each slice may be capable of many independent functions in each of the plurality of numerical modes. Such independent functions may include multiply-accumulate (MACC), multiply add, four-input add, barrel shift, wide-bus multiplexing, magnitude comparison, bit-wise logic functions, pattern detection, and wide counter operations. The slices may further be used in combination for performing wide math functions, DSP filtering operations, and complex arithmetic without the use of general FPGA logic.

In light of the above general understanding, various implementations for digital signal processing data path elements or slices are generally described below.

Because one or more of the above-described implementations are described as using a particular type of IC, a detailed description of an example IC is provided below. However, it should be understood that other types of ICs may benefit from one or more of the implementations described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing data path elements or blocks ("DSPs"), processors, clock managers, delay lock loops ("DLLs"), and so forth. As used herein, "include" and "including" mean including without limitation.

Each programmable tile may typically include both programmable interconnect and programmable logic. The programmable interconnect may typically include a large number of interconnect lines of varying lengths interconnected by programmable interconnect points ("PIPs"). The programmable logic implements the logic of a user design using programmable elements that may include, for example, function generators, registers, arithmetic logic, and so forth.

The programmable interconnect and programmable logic may typically be programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device may be controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs may be programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, some FPGAs may include a number of different types of programmable logic blocks in their arrays. For example, an FPGA architecture may include a large number of different programmable tiles which may include multi-gigabit transceivers (MGTs), configurable logic blocks (CLBs), random access memory blocks (BRAMs), input/output blocks (IOBs), configuration and clocking logic (CONFIG/CLOCKS), DSP blocks, and specialized IO blocks (such as configuration ports, digital clock managers, analog-to-digital converters, system monitoring logic, and so on). Some FPGAs may also include dedicated processor blocks.

In some FPGAs, each programmable tile may include a programmable interconnect element (INT) having standardized connections to and from a corresponding interconnect element in each adjacent tile. The programmable interconnect elements, taken together, may implement the programmable interconnect structure for the FPGA. Each programmable interconnect element may also include the connections to and from the programmable logic element within the same tile.

For example, a CLB may include a configurable logic element (CLE) which may be programmed to implement user logic and a programmable interconnect element. A BRAM may include a BRAM logic element (BRL) in addition to one or more programmable interconnect elements. The number of interconnect elements included in a tile may depend on the height of the tile. In some implementations, a BRAM tile may have a height equal to an integer number of CLBs, such as 4, 5 or another suitable number. A DSP tile may include a DSP logic element (DSPL) in addition to an appropriate number of programmable interconnect elements. An IOB may include, for example one or more instances of an input/output logic element (IOL), such as two IOLs, in addition to an instance of the programmable interconnect element. The actual I/O pads connected, for example, to the I/O logic element may not be confined to the area of the I/O logic element.

In some implementations, an area of the die may be used for configuration, clock, and other control logic. Such an area of the die may be a horizontal or vertical area located near the center of the die in some implementations. Vertical columns may extend from such a horizontal area (or rows extending from such a vertical area) may be used for distributing clocks and configuration signals across the FPGA.

Some FPGAs may include additional logic blocks which may disrupt the regular column structure making up a large part of the FPGA. For example, such additional logic blocks may include programmable blocks a or dedicated logic, such as a processor block, which may span a number of columns of CLBs and BRAMs.

Figure 1:
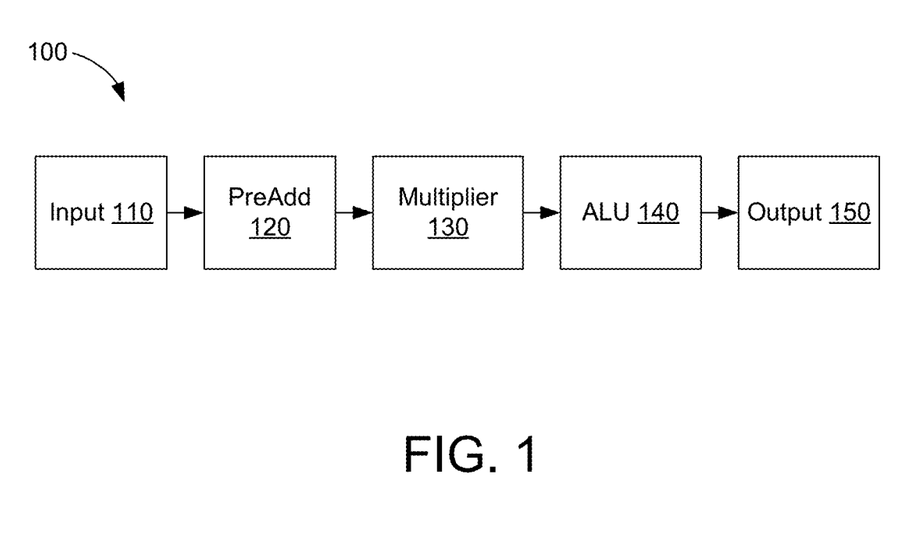
FIG. 1 shows a simplified block diagram of a DSP slice within which the example implementations may be embodied.

FIG. 1 shows a simplified block diagram of a DSP slice 100, within which the example implementations may be embodied. More particularly, DSP slice 100 may include an input module 110, a preadd module 120, a multiplier 130, an arithmetic logic unit (ALU) 140, and an output 150. Each of the modules making up DSP slice 100 may include one or more logic elements and interconnect elements, as discussed above. Input module 110 may be configured to receive and buffer one or more input signals. Preadd module 120 may be configured to perform one or more arithmetic operations on the received one or more inputs, such as one or more addition operations. Multiplier 130 may be configured to perform one or more multiplication operations on the received inputs or on one or more outputs of preadd module 120. ALU 140 may be configured to perform one or more operations on the received input signals, or on one or more outputs of preadd module 120 or multiplier 130. Note that FIG. 1 shows only a simplified high-level depiction of the modules of an example DSP slice, and as such does not fully represent the connectivity between the modules shown. One or more modules may be bypassed between the input 110 and the output 150. For example, rather than providing the one or more input signals to the preadd module, input 110 may provide the one or more input signals directly to the multiplier 130 or the ALU 140. Details of these functions are discussed in more detail below. More particularly, each of the modules 110-150 shown in FIG. 1 may include one or more elements described below with respect to FIG. 2.

As discussed above, the example implementations may enable each of a plurality of numerical modes to be implemented in a single DSP slice, thus providing improved operations. More particularly, in conventional DSP slices, performing a number common operations may require the use of additional fabric resources, such as fabric routing resources. For example, such operations may include dot product computation, matrix multiplication, FIR filtering, and so on. The use of such additional fabric resources may be a significant limiting factor for the speed at which these operations may be performed. Thus, example implementations may limit the required fabric resources required for performing such operations by enabling an example DSP slice to operate in the plurality of numerical modes. In some examples the plurality of numerical modes may include fixed-point numerical modes as well as floating-point numerical modes. The numerical modes may also include complex integer numerical modes. In one example implementation the numerical modes may include a 24 bit fixed point integer mode (INT24), an 8 bit fixed point integer mode (INT8), an 18 bit complex fixed point integer mode (CINT18), and a 32 bit binary floating point mode (FP32). Note that while these modes are referred to herein as numerical modes, they may be referred to as precision modes, or alternately as numerics.

Figure 2:
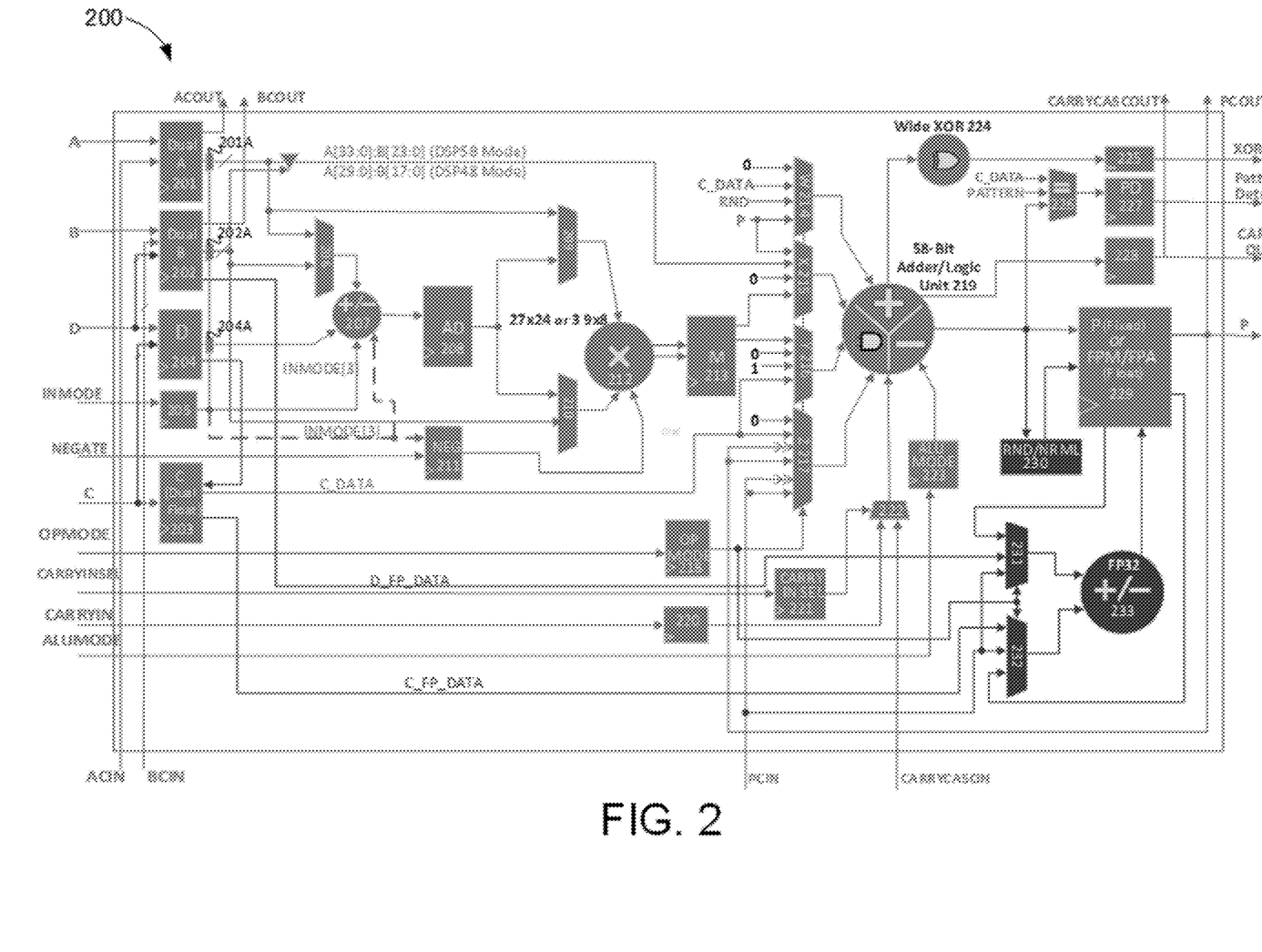
FIG. 2 is a schematic diagram depicting a DSP slice in accordance with some implementations.

FIG. 2 shows a block diagram of a DSP slice 200, according to the example implementations. As discussed above, the DSP slice 200 may implement each of the plurality of numerical modes, such as an INT24 numerical mode, an INT8 numerical mode, a CINT18 numerical mode, and an FP32 numerical mode. The DSP slice 200 may be configured to operate in a selected one of the plurality of numerical modes based on one or more control signals or attributes, such as one or more bits in a received bitstream. In one implementation the numerical mode may be set based on one or more bits of a configuration bitstream. More particularly, in one such implementation the mode may be selected based on a decoded value of one or more configuration memory cells, where the value of the one or more configuration memory cells is set using the configuration bitstream. In some implementations, the configuration bitstream may be generated using a software tool, such as an Electronic Design Automation software tool, or "EDA tool" which may include one or more abstracted models of example DSP slices. A particular model chosen to abstract an example DSP slice may be determined explicitly (based on direct instantiation within a chosen design for the PLD), or implicitly (based on the EDA tool's inference of the intended functionality and operation of a given design to be implemented by the PLD). An example explicit determination may be by a designer composing a representation (such as a Hardware Design Language or HDL representation) of a circuit design which configures the example DSP slice into a selected numerical mode. In contrast, in an example implicit determination, the EDA tool may infer that an intended operation or function to be performed may be achieved by configuring the example DSP slice to operate in a selected numerical mode.

With respect to FIG. 2, the DSP slice 200 may receive four input data buses, denoted A. B, C, and D in FIG. 2. In some implementations the A input bus may be a 34 bit input bus, the B input bus may be a 24 bit input bus, the C input bus may be a 58 bit input bus, and the D input bus may be a 27 bit input bus. The A, B, C, and D input buses may be received by respective registers 201, 202, 203, and 204. Note that in some implementations the A input register 201 and the B input register 202 may also receive respective cascade inputs ACIN and BCIN, for example from respective cascade out signals from a second DSP slice (such as an adjacent DSP slice) and may output respective cascade out signals ACOUT and BCOUT to another DSP slice. For example, the DSP slice 200 may be coupled to an adjacent DSP slice having the same structure as DSP slice 200, and the ACIN and BCIN signals may correspond to respective ACOUT and BCOUT signals output from the adjacent DSP slice. Such cascaded inputs may be used for example, for applications such as FIR filtering, complex multiplication, multiple precision multiplication, complex multiply accumulate (MACC) operations, and so on. In some implementations the registers 201, 202, 203, and 204 may be part of the input stage 110 shown in FIG. 1.

Note further that in some implementations the D input bus may also be provided to the B input register 202, for example for use in the FP32 numerical mode, as discussed further below. In some implementations, one or more outputs from the A, B, and D input registers 201, 202, and 204 may be provided to the pre-adder 207. In some implementations, one or more of the A, B, and D inputs may be provided to the pre-adder 207. For example, the A input, the B input, or the D input may be selected as an input to the pre-adder 207. For example, the multiplexer 206 may control which of the A input, the B input, or the D input is provided to the pre-adder 207.

The DSP slice 200 may also receive an INMODE control signal. INMODE may be a control signal which is provided to the INMODE register 205. INMODE may include a number of bits, such as 5 bits. Some bits of INMODE may provide selection control for the A and B input registers, such as by providing control inputs to respective multiplexers 201A and 202A. For example, the A and B input registers 201 and 202 may be dual input registers, allowing for two pipeline stages, and INMODE may provide for selection of either a first stage (A1 or B1, respectively) or a second stage (A2 or B2, respectively). INMODE may similarly control balanced pipelining when dynamically switching between multiply and add operations. Further, INMODE may control multiplexing between the D input register 204 and the A or B input registers 201 or 202 (for example using one or more of multiplexers 201A, 202A, and 204A). INMODE may further provide subtract control for the pre-adder 207.

The DSP slice 200 may also receive a NEGATE control signal, which may be provided to NEGATE register 211, and provided to the multiplier 212. NEGATE may control some aspects of the multiplier 212, as discussed further below. For example, NEGATE may control a sign of inputs to multiplier 212, providing for multiplication by a negated input.

The DSP slice 200 may also receive an OPMODE control signal which may be provided to OPMODE register 218. For example, OPMODE may provide multiplexer control signals for W multiplexer 214, X multiplexer 215, Y multiplexer 216, and Z multiplexer 217. These multiplexers may control selection of the four inputs to the ALU 219. For example, the inputs to the ALU 219 may include 4 58-bit inputs provided from the W multiplexer 214, X multiplexer 215, Y multiplexer 216, and Z multiplexer 217.

The DSP slice 200 may further receive an ALUMODE control signal which may be provided to ALUMODE register 223. ALUMODE may control the functions to be performed by ALU 219. For example, ALUMODE may configure the ALU 219 to perform four-input arithmetic operations on the four inputs received from W multiplexer 214, X multiplexer 215, Y multiplexer 216, and Z multiplexer 217. For example, ALUMODE may configure the ALU 219 to output Z+W+X+Y+CARRYIN, Z−(W+X+Y+CARRYIN), or other four-input arithmetic operations. Further ALUMODE may configure the ALU 219 to perform logical operations on two or more of the inputs provided by W multiplexer 214, X multiplexer 215, Y multiplexer 216, and Z multiplexer 217. For example, ALUMODE may configure the ALU 219 to determine XOR, XNOR, AND, NAND, NOT, OR, and NOR operations on the W, X, Y, and Z inputs.

The DSP slice 200 may further receive a CARRYINSEL control signal, which may be provided to CARRYINSEL register 221. CARRYINSEL may control which input is provided as a carry input signal to ALU 219. For example, CARRYINSEL may be provided as a control input to multiplexer 222 for selecting one of a plurality of inputs as the carry input signal to ALU 219. The plurality of inputs to multiplexer 222 may include a CARRYIN input signal (provided to multiplexer 222 via CARRYIN register 220), a CARRYCASCIN signal and a CARRYCASCOUT signal (cascade signals used for large addition/subtraction/accumulation operations including two adjacent DSP slices).

The DSP slice 200 may further include a pre-adder 207 (which may be included in the preadd module 120 of FIG. 1. The DSP slice 100 may further include an AD register 208. The DSP slice 200 may further include a multiplexer 209, multiplexer 210, and multiplier 212, and multiplier register 213, which may each be included in the multiplier 130 of FIG. 1. The DSP slice 200 may further include a W multiplexer 214, X multiplexer 215, Y multiplexer 216, Z multiplexer 217, ALU 219, and multiplexer 222, each of which may be included in the ALU module 140 of FIG. 1. The DSP slice 200 may further include an XOR 224, XOR register 225, pattern detection multiplexer 226, and pattern detection register 227. The DSP slice 200 may further include a carry out register 228, and output register (P) 229, which may be included in the output stage 150 of FIG. 1. The DSP slice 200 may further include rounding/normalization module 230, first floating point multiplexer 231, second floating point multiplexer 232, and floating point adder 233, which may in some implementations be included in the ALU module 140 of FIG. 1. The functions of these components are discussed below in the context of the multiple numerical modes implemented by DSP slice 200. Further discussion of these components may be found in "UltraScale Architecture DSP Slice User Guide," published Jun. 4, 2018, by Xilinx, and available at https://www.xilinx.com/support/documentation/user_guides/ug579-ultrascale-dsp.pdf, which is hereby incorporated by reference.

As mentioned above, the example implementations provide DSP slices capable of operating in each of a plurality of numerical modes, such as an INT24 numerical mode, an INT8 numerical mode, a CINT18 numerical mode, and an FP32 numerical mode. However, not all components of an example DSP slice may be used for all numerical modes. For example, with respect to DSP slice 200, some components, such as rounding/normalization module 230, first and second floating point multiplexers 231 and 232, and floating point adder 233 may only be used in the FP32 numerical mode. Consequently, such components may be placed in a low-power state when the FP32 numerical mode is not enabled. In some implementations, the components of the DSP slice 200 may be individually enabled or disabled, while in some other implementations the components may be grouped into a plurality of elements called "atoms." The components or atoms not used with an enabled numerical mode may be placed in the low-power state. For example, when the multiplier 212 is not used, it may receive one or more control bits, such as a USE_MULT attribute, signaling that the multiplier 212 is to enter the low-power state. In one implementation, the ALU 219 may be configured for single instruction multiple data (SIMD) operations implementing a four-input adder/subtractor, which does not require use of the multiplier 212, and the multiplier 212 may therefore be signaled to enter the low power state during such operations. Similar attributes may be used for placing other components of the DSP slice 200 into the low-power state when they are not needed.

Figure 3:
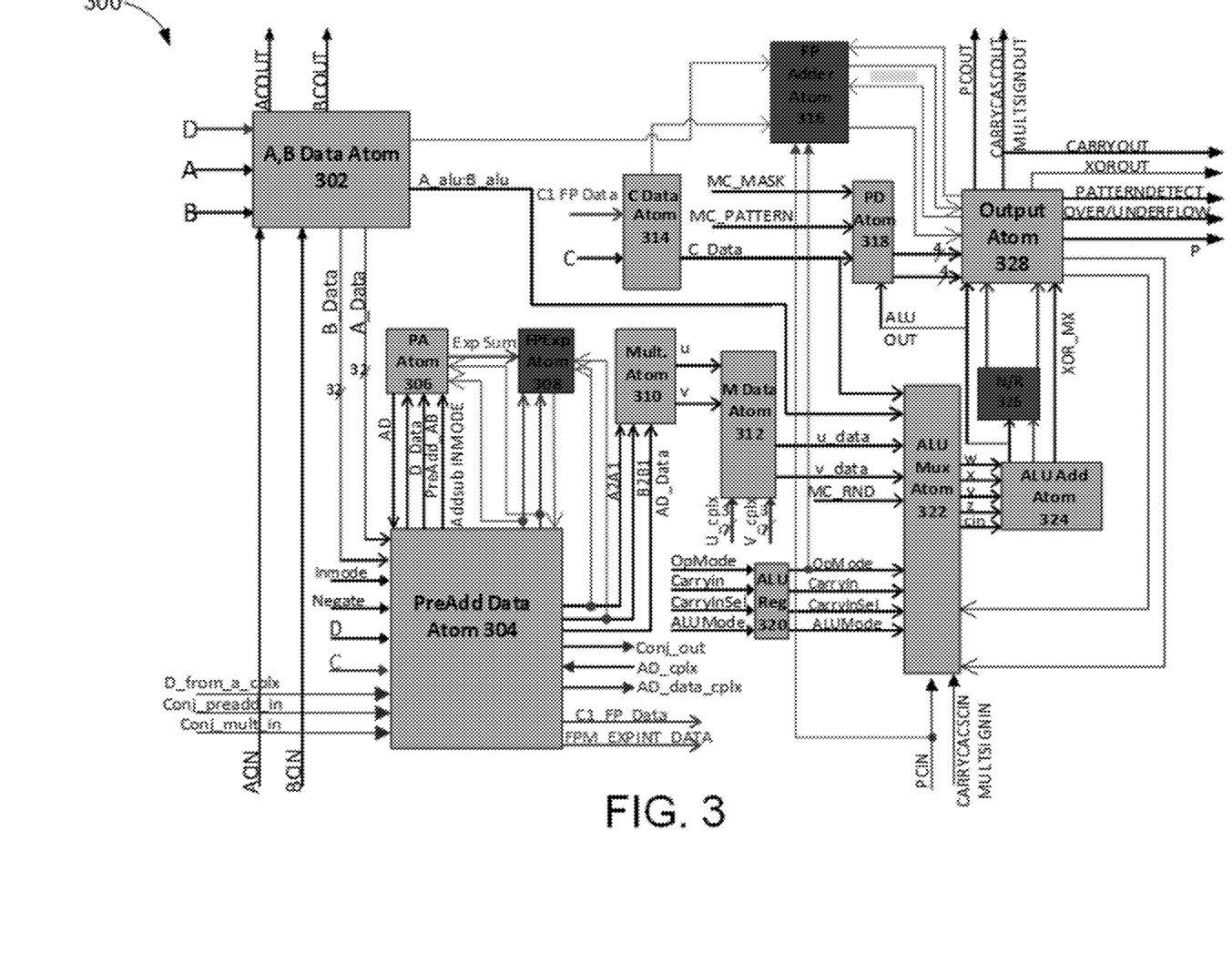
FIG. 3 is a block diagram of an example DSP slice, where the components of the DSP slice are grouped into functional atoms.

FIG. 3 shows an example block diagram 300 of the DSP slice 200, according to some implementations. More particularly, FIG. 3 shows components of the DSP slice 200 grouped into functional atoms, as mentioned above. Thus, FIG. 3 includes an A and B data atom 302. For example, the A and B data atom 302 may include dual A register 201, dual B register 202, and associated multiplexers (such as one or more of multiplexers 201A, 202A, 204A, and 206). FIG. 3 further includes a preadd data atom 304 and preadd atom 306. These atoms may for example include pre-adder 207 and related components of DSP slice 200. For example, preadd data atom 304 may include the D input register 204, INMODE register 205, and may receive control signals such as INMODE and NEGATE. Preadd data atom 304 may also receive one or more signals from an adjacent DSP slice, such as one or more signals relating to complex multiplication and conjugation, as discussed below with respect to the CINT18 numerical mode. FIG. 3 further includes a floating point exponent atom 308, discussed below with respect to the FP32 numerical mode. FIG. 3 further includes a multiplier atom 310 and a multiply data atom 312. These atoms may include the multiplier 212 and related components of DSP slice 200. FIG. 3 further includes a C Data atom 314, which may include components such as C data register 203. FIG. 3 may further include a floating point adder atom 316, which is further described below with respect to the FP32 numerical mode. FIG. 3 may further include a pattern detection atom 318, which may include components relating to pattern detection, such as pattern detector 226 and pattern detection register 227. FIG. 3 may further include an ALU regulator atom 320, which may receive control signals relating to the functions of ALU 219, such as OPMODE, CARRYIN, CARRYINSEL, and ALUMODE. These control signals may be provided from the ALU regulator atom 320 to an ALU and MUX atom 322. ALU and MUX atom 322 may include components such as the ALU 219, and related components such as W, X, Y, and Z multiplexers 214-217. FIG. 3 may further include a normalization and rounding atom 326, which may perform operations discussed below with respect to the FP32 numerical mode. Finally, FIG. 3 may include an output atom 328, which may incorporate components relating to outputs of the DSP slice 200, such as output register 229 and related components. Note that several of the atoms are used only in the FP32 numerical mode. When the DSP slice 200 is not operating in the FP32 numerical mode, these atoms (308, 316, and 326) may be configured to be in a low power state or to be otherwise disabled when the DSP slice is not in the FP32 numerical mode.

As noted above, DSP slices according to some example implementations may be capable of operating in a plurality of numerical modes, one of which may be an INT24 numerical mode. When configured to operate in the INT24 numerical mode, the DSP slice 200 may be configured to provide a number of functions using the components shown in FIG. 2. For example, the multiplier 212 may be configured to support 27 bit by 24 bit two's complement multiplication. In some aspects, the multiplier 212 may include a modified booth encoder. The ALU 219 may be configured to perform bitwise logic operations such as two-input AND, OR, NOT, NAND, NOR, XOR, and XNOR operations. The wide XOR 224 may be configured to support up to 116-bit wide XOR functions. Wide XOR 224 may also be configured to support 12-bit, 22-bit, 24-bit, 34-bit, or 58-bit XOR functions. Pre-adder 207 may support 27-bit operations such as addition and subtraction. Outputs of the pre-adder 207 may provide input to the multiplier 212. For example, the output of the pre-adder 207 may be provided as two inputs to the multiplier 212 to allow for squaring operations to be performed by the multiplier 212. For example, the output of the pre-adder 207 may be provided both to multiplexer 209 and to multiplexer 210 for input to multiplier 212. Similarly, the A input or the B input may be provided as both inputs to the multiplier 212 for similar squaring operations. Alternately, the pre-adder 207 may be bypassed, such that the D input is provided to the multiplier instead of the A or B inputs.

In some implementations, only a portion of the A input may be provided as an input to an A input of the multiplier 212. For example, if A is a 34-bit input, as mentioned above, then 27 bits (such as the lower 27 bits) of the 34-bit A input may be provided as the A input of the multiplier 212. The entire 34-bit A input may be used in combination with the B input to provide a concatenated internal bus. For example, the 34-bit A input may form the upper 34 bits of such a concatenated bus, while the 24-bit B input may provide the lower 24 bits, thus forming a 58-bit A:B concatenated internal bus.

The DSP slice 200 may further receive cascade control signals such as CARRYCASCIN and CARRYCASCOUT. These control signals may enable adjacent DSP slices (such as two adjacent copies of DSP slice 200) to implement cascaded accumulators/adders/subtractors. For example, CARRYCASCIN and CARRYCASCOUT may enable the adjacent DSP slices to implement 116-bit accumulators, adders, and/or subtractors.

As mentioned above, in the INT24 numerical mode, the ALU 219 may support SIMD operations. For example, such SIMD operations may include dual 24-bit SIMD addition/subtraction/accumulation operations. These operations may have two separate CARRY OUT signals. Additionally, the SIMD operations may include quad 12-bit SIMD addition/subtraction/accumulation operations. These quad 12-bit SIMD operations may have four separate CARRY OUT signals.

The DSP slice 200 may further include a pattern detector 226, whose output may be provided to a pattern detector register 227. For example, the pattern detector 226 may determine if the output P of the DSP slice 200 matches a specified pattern (as specified by the PATTERN input to pattern detector 226). The specified pattern may be masked in some implementations. The pattern detector 226 may further support convergent rounding (in combination with the C input), overflow/underflow support, and accumulator terminal count (a counter auto reset).

Figure 4A:
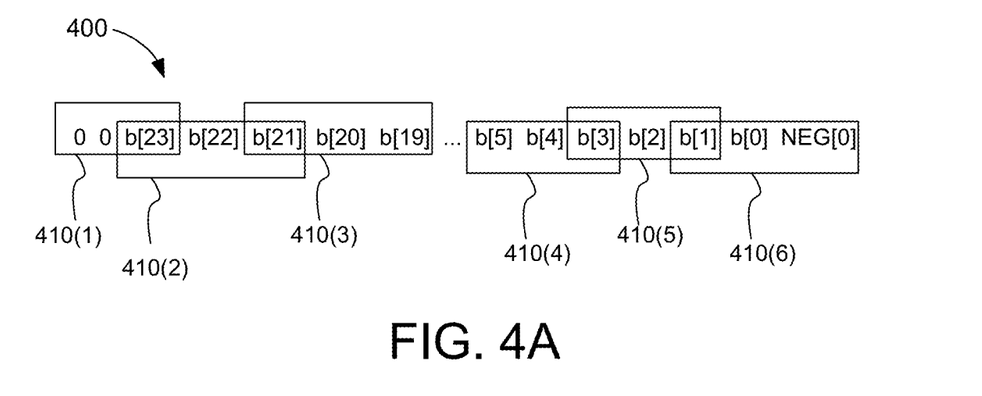
FIG. 4A shows an example grouping of a 24-bit B input for a booth encoder configured for use in a 24-bit fixed-point numerical mode, according to some implementations.

As mentioned above, the multiplier 212 may include a modified booth encoder. This booth encoder may be used in both the INT24 numerical mode and the INT8 numerical mode. In the INT24 numerical mode, the multiplier may reduce the number of partial products using radix-4 booth recoding. More particularly, in the INT24 mode, two bits of the b input may be grouped together into 3-bit groups, with the last bit from the previous group included with two bits from the current group. FIG. 4A shows an example grouping 400 of a 24-bit B input for such a booth encoder, according to some implementations. With respect to FIG. 4A, each of the groups 410(1)-410(6) includes three bits, such that one bit overlaps with a bit from the previous group. Thus, a first group 410(1) includes two zeros, and a most significant bit b[23] of the B input, where b[23] refers to the most significant bit of the 24-bit B input. A second group 410(2) includes b[23], b[22], and b[21], and a third group 410(3) includes b[21], b[20], and b[19]. The pattern proceeds for the remaining bits of the B input, including groups 410(4) and 410(5), respectively including b[5], b[4], b[3], and b[3] b[2] b[1]. A final group 410(6) includes b[1], b[0], and NEG[0]. NEG[0] refers to the zeroth bit of the NEGATE control input, discussed above. When NEG[0] is asserted, the B input is inverted for use in the multiplier 212.

The DSP slice may also be configured to operate in the INT8 numerical mode. The INT8 numerical mode may be used as a low-precision mode, supporting operations such as matrix multiplication using less memory storage and bandwidth than other numerical modes, such as the FP32 numerical mode. For example, the INT8 numerical mode may reduce required memory storage and bandwidth by a factor of 4 compared with the FP32 numerical mode. Matrix multiplication may require a series of dot product computations. Thus, in the INT8 numerical mode, the DSP slice 200 may be configured to compute dot products (alternately referred to as inner products) between two vectors. More particularly, the DSP slice 200 may be configured to compute dot products between a first vector $\vec{a}$ and a second vector $\vec{b}$, such that $\vec{a}=(a_0, a_1, a_2)$ and $\vec{b}=(b_0, b_1, b_2)$, where each $a_i$ is a 9-bit two's complement fixed point number, and each $b_i$ is an 8-bit two's complement number. For example, $a_0$ may correspond to bits a[8], a[7], ..., a[1], and a[0] (the eighth through zeroth bits of the A input, which may also be referred to as a[7:0]), while $b_0$ may correspond to bits b[7:0] (the seventh through zeroth bits of the B input). Computing these vector dot products may also use the booth encoder of the multiplier 212, however the groupings used in combination with the INT8 numerical mode are different from those discussed above for use with the INT24 numerical mode. The INT8 mode may further enable computation of such vector dot products with element-wise negation, where the element-wise negation is indicated using three bits of the NEGATE control signal. That is, rather than simply using one bit of the NEGATE control signal to negate the B input as a whole, as discussed above with respect to the INT24 numerical mode, each of the $b_i$ may individually be negated.

Figure 4B:
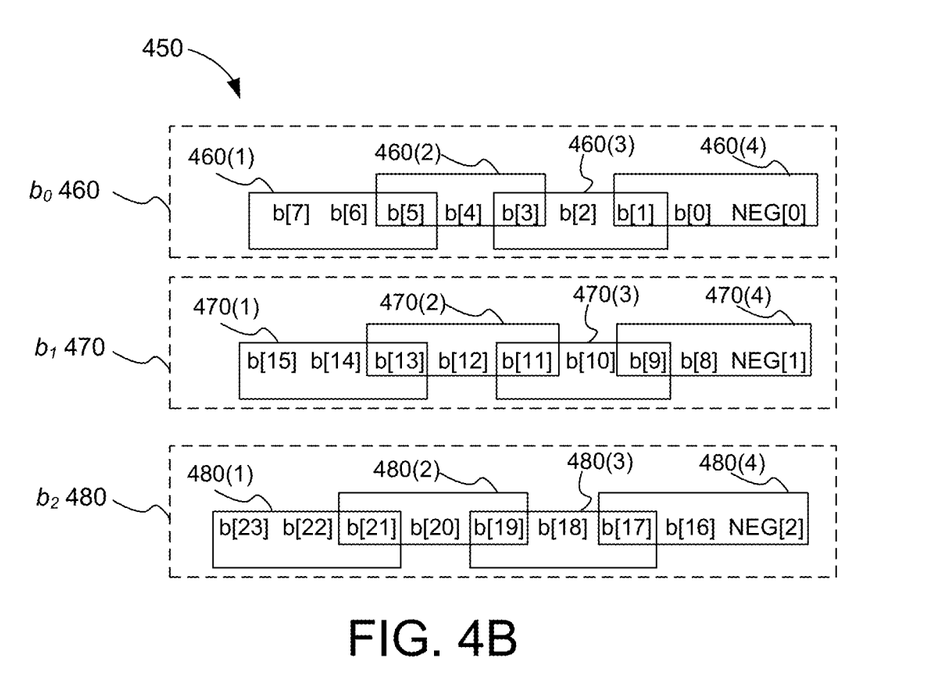
FIG. 4B shows an example grouping of bits of the 24-bit B input for use in a vector dot product computation in an 8-bit fixed-point numerical mode, according to some implementations.

FIG. 4B shows an example grouping 450 of bits of the B input for use in such a vector dot product computation. With respect to FIG. 4B, the grouping 450 includes 4 groups corresponding to each of the $b_i$. Thus $b_0$ 460 corresponds to groups 460(1), 460(2), 460(3), and 460(4), $b_1$ 470 corresponds to groups 470(1), 470(2), 470(3), and 470(4), and $b_2$ 480 corresponds to groups 480(1), 480(2), 480(3), and 480(4). As with the groups in the INT24 mode, each group includes three bits, with one bit overlapping with a previous group, and a final bit including a bit of the NEGATE control signal. Thus, $b_0$ 460 has a first group 460(1) including b[7], b[6], and b[5], a second group 460(2), including b[5], b[4], and b[3], a third group 460(3) including b[3], b[2], and b[1], and a final group 460(4) including b[1], b[0], and NEG[0]. The other $b_i$ include similar groupings, as shown in FIG. 4B. As with the INT24 mode, the NEGATE control signal is used for changing the signs of inputs to the multiplier 212, however, in the INT8 mode, each of the $b_i$ may be individually negated for input to the multiplier 212. Thus, a first bit of the NEGATE control signal, NEG[0] may be used for changing the sign of $b_0$, a second bit of the NEGATE control signal, NEG[1], may be used for changing the sign of $b_1$, and a third bit of the NEGATE control signal, NEG[2], may be used for changing the sign of $b_3$, as shown in FIG. 4B.

Thus, in the INT8 numerical mode, the modified booth encoder of the multiplier 212 may be configured to compute the terms $a_0 b_0$, $a_1 b_1$, and $a_2 b_2$, and to combine these terms to determine the dot product $a_0 b_0 \pm a_1 b_1 \pm a_2 b_2$, where three bits of the NEGATE control signal determine the sign of each term added to the dot product, as described above.

In some example DSP slices, the partial products $u_i$ and $v_i$ may be added in an array reduction block with the INT8 partial products grouped for faster computation. The sums of these partial products may represent the $a_i b_i$ terms of the dot product as follows:

$$u_0 + v_0 = \pm a_0 b_0$$

$$u_1 + v_1 = \pm a_1 b_1$$

$$u_2 + v_2 = \pm a_2 b_2$$

Thus, the dot product may be computed by summing the $u_i + v_i$ terms to yield:

$$u + v = \sum_{i=0}^{2} u_i + v_i = a_0 b_0 \pm a_1 b_1 \pm a_2 b_2$$

In some examples, a first stage of the addition of these partial products may be implemented using a first 4:2 adder which may be enabled in the INT8 numerical mode as a part of the array reduction block to add $u_0 + v_0$ and $u_2 + v_2$. A second 4:2 adder may also be implemented in the INT8 numerical mode (and also in the CINT18 numerical mode described below). The second 4:2 adder may be implemented prior to an optional partial product pipeline register and may add the third term of the dot product $u_1+v_1$ to complete the computation of the dot product $u+v=a_0b_0 \pm a_1b_1 \pm a_2b_2$. Further, as discussed above, the inputs to the multiplier may be pipelined. Let AMULT and BMULT be the respective outputs of the multiplexers 209 and 210— the inputs to the multiplier 212. Accordingly, the dot product may be computed as in the following equation:

$$u+v=(-1)^{NEG[0]}AMULT[8:0]BMULT[7:0]+(-1)^{NEG[1]}\\AMULT[17:9]BMULT[15:8]+(-1)^{NEG[2]}AMULT\\{}[26:18]BMULT[23:16]$$

As discussed above, example DSP slices may further be configured to operate in a CINT18 numerical mode—an 18-bit complex integer fixed point numerical mode. In order to operate in the CINT18 numerical mode, two DSP slices (such as two adjacent copies of DSP slice 200) may be coupled with logic enabling the two slices to operate as a single 18-bit complex multiplier. For example, in the CINT18 numerical mode, the two DSP slices may be configured to compute products between a first complex number and a second complex number, where each of the complex numbers may be represented as an 18-bit real component and an 18-bit imaginary component. More particularly, a first DSP slice may be configured to compute real-term components of the complex product, a second DSP slice may be configured to compute imaginary-term components of the complex product, and further logic may be configured to compute common terms of the complex product. The further logic may be located on the first DSP slice, on the second DSP slice, or may be shared between the first DSP slice and the second DSP slice.

In some conventional DSP slices, in addition to two DSP slices, additional fabric logic was required in order to perform complex multiplication operations. As discussed above, the additional fabric logic may slow operations, as the fabric routing and logic may form timing-critical paths, requiring conventional DSP slices to run at slower clock speeds. The example DSP slices allow such operations to be performed without the additional fabric logic, resulting in faster operating speeds. The example DSP slices may also perform complex conjugation operations without requiring additional fabric logic, as discussed below.

Figure 5:
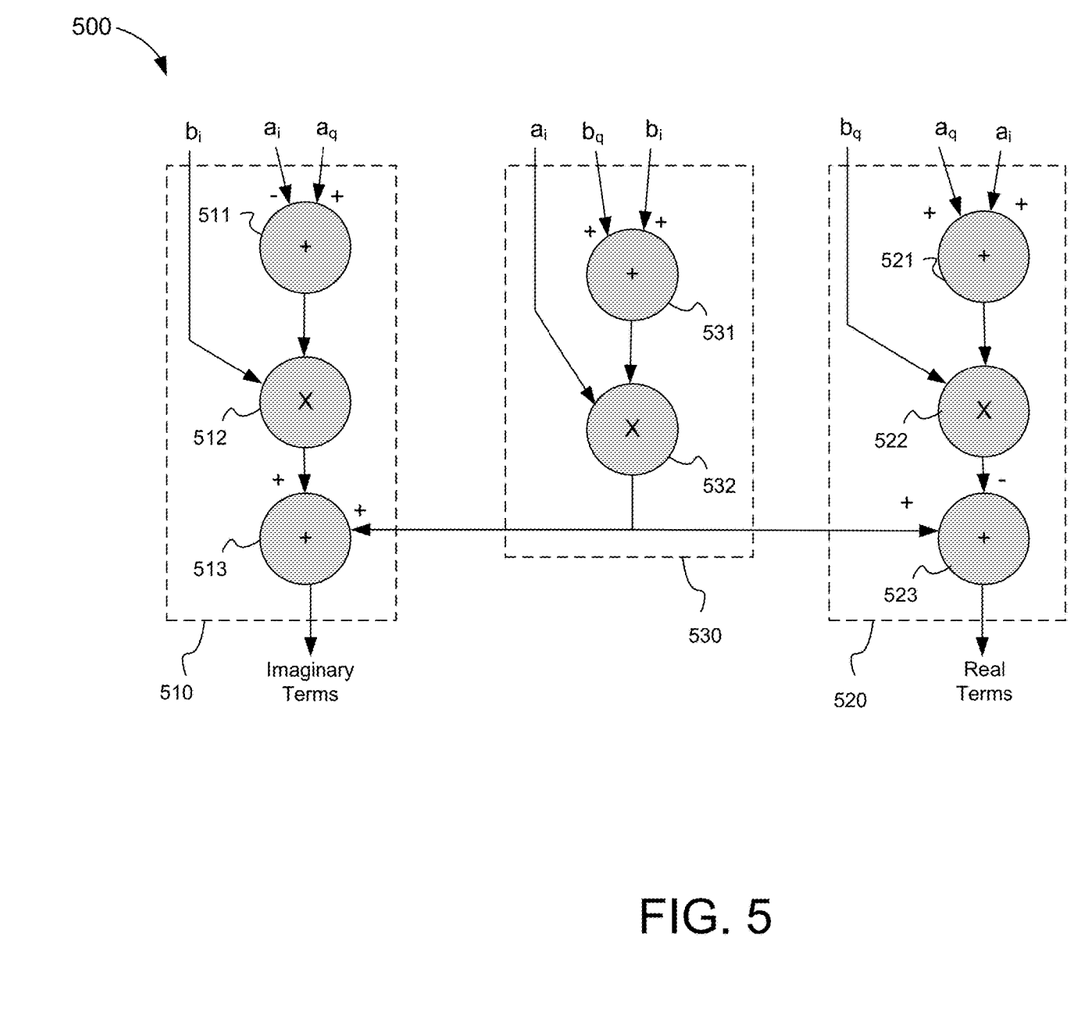
FIG. 5 shows a block diagram of operations for performing complex multiplication using example DSP slices configured to operate in an 18-bit complex integer fixed-point numerical mode, according to some implementations.

FIG. 5 shows a block diagram 500 of operations for performing complex multiplication using example DSP slices configured to operate in the CINT18 numerical mode, according to some implementations. As noted above, in the CINT18 numerical mode, two DSP slices may be configured to compute a product between two complex numbers. More particularly, the complex product may be between a first complex number $a_I+ja_Q$ and a second complex number $b_I+jb_Q$. A first portion 510 of the operations, performed by a first DSP slice, may compute the imaginary terms of the product. A second portion 520 of the operations, performed by a second DSP slice, may compute the real terms of the product. A third portion 530 of the operations may compute common terms of the product. As noted above, the common term, computed by the third portion 530, may be determined by the first DSP slice and/or by the second DSP slice. In some implementations the common term may be computed using logic which is shared between two adjacent DSP slices. This shared logic may in some implementations only be used in the CINT18 numerical mode. For example, the shared logic may correspond to one or more atoms of the DSP slice 200, which may be configured to be in a low power state unless the DSP slice 200 is in the CINT18 numerical mode.

The complex product between the first complex number and the second complex number may be computed as follows:

$$(a_I+ja_Q)(b_I+jb_Q)=(K-b_Q(a_Q+a_I))+j(K+b_I(a_Q-a_I))$$

where $K=a_I(b_I+b_Q)$. Thus, the real components of the product may be determined as $(K-b_Q(a_Q+a_I))$, while the imaginary components of the product are $(K+b_I(a_Q-a_I))$, with $K=a_I(b_I+b_Q)$ representing a common term in both the real and imaginary components.

With respect to FIG. 5, The first and the second DSP slice may receive the first and the second complex numbers—for example, the first and the second complex numbers may be provided as inputs to the first and the second DSP slices— for example using the A, B, C, and D inputs. The first portion 510 may begin computing the imaginary terms of the product by using an adder 511 to compute $(a_Q-a_I)$. For example, the first DSP slice may compute this term using the pre-adder 207 to subtract $a_I$ from $a_Q$ (as noted above, INMODE may control the pre-adder 207 to perform addition or subtraction). This difference may be provided to multiplier 512, which may be multiplier 212 of the first DSP. The real component of the second complex number, $b_I$, may also be provided to the multiplier 512 to compute the product $b_I(a_Q-a_I)$. This product may be provided to the adder 513, which may also receive the common term K from the third portion 530 and sum these terms to compute the imaginary terms of the complex product $(K+b_I(a_Q-a_I))$. The adder 513 may correspond to the ALU 219 of the first DSP slice.

Similarly to the first portion 510, the second portion 520 may use an adder 521 to compute $(a_Q+a_I)$, for example by using a pre-adder 207 of the second DSP slice to compute this sum. This sum may be provided to multiplier 522, which may also receive the imaginary component of the second complex number, N. The multiplier 522 may be the multiplier 212 of the second DSP slice. The product determined using multiplier 522, $b_Q(a_Q+a_I)$, may then be provided to adder 523. Adder 523 may be the ALU 219 of the second DSP slice, and may also receive the common term K from the third portion 530. The adder 523 may compute the difference $(K-b_Q(a_Q+a_I))$. This difference is the real component of the complex product.

The third portion 530 may compute the common term K by using an adder 531 to sum $b_Q$ and $b_I$, and then a multiplier 532 to compute the product between this sum and $a_I$ in order to generate the common term $K=a_I(b_I+b_Q)$, which may be provided to both the first portion 510 and the second portion 520.

In some implementations, the DSP slice 200 may further be configured to perform complex multiply-accumulate operations. Such multiply-accumulate operations may perform the above-described complex multiplication operations (i.e., multiplying two 18-bit complex numbers), and use the 58-bit C inputs of two adjacent DSP slices for 58-bit real and imaginary feedback. As described above, the ALU 219 (which may perform the functions of adders 513 and 523 of FIG. 4) may be configured to perform the addition and accumulation operations. In some other implementations, the DSP slice 200 may be configured to perform complex addition operations using two adjacent DSP slices, using the C inputs of the two DSP slices as a complex 58-bit input, for performing 58-bit complex addition operations.

The complex multiplier described above and depicted in FIG. 5 may also be configured to perform complex conjugate multiplication. More particularly, either or both of the first complex number $a_I+ja_Q$ and the second complex number $b_I+jb_Q$ may be conjugated before the complex multiplication operations are performed. For example, performing such complex conjugate multiplication may be performed by selectively configuring the adders of FIG. 5 to perform addition or subtraction, and selectively configuring the multipliers of FIG. 5 to selectively negate inputs. More particularly, as discussed above, the pre-adder of each DSP slice (corresponding to adders 511 and 521) is configured to control addition or subtraction using a bit of the INMODE control signal, such as INMODE[3]. Further, the INMODE control signal may also control selective product negation in the multipliers. As discussed above, the booth encoder of the multiplier 212 may support product negation. In some implementations, rather than using the NEGATE control signal for product negation, the bit of the INMODE control signal (such as INMODE[3]) may be used to configure the multipliers for complex conjugate multiplication. This INMODE control signal bit may also be pipelined.

As discussed above, the DSP slice 200 may also be configured to operate in a 32-bit floating-point (FP32) numerical mode. The example DSP slices may be configured to perform floating-point multiply and add operations, as well as floating-point accumulate operations. Similarly to the CINT18 mode, these operations may be performed without the use of additional fabric logic and routing resources by coupling DSP slices together, allowing the DSP slices to achieve faster operating speeds as compared to conventional DSP slices which require the use of the additional fabric resources. For example, the DSP slice 200 may include floating point atoms which may be used in combination with the fixed-point atoms to implement a floating point arithmetic mode when the DSP slice operates in the FP32 numerical mode. More particularly, with respect to FIG. 2, the DSP slice may include rounding and normalization module 230, first and second floating point multiplexers 231 and 232, and floating point adder 233. Further, the floating point components may be grouped into atoms, as shown in FIG. 3. For example, these atoms may include floating point exponent atom 308, floating point adder atom 316, and normalization and rounding atom 326. As noted above, these atoms may be selectively enabled when needed, and placed into a low power state when not needed. For example, when the DSP slice is operating in one of the fixed-point numerical modes, such as INT8 or CINT18, these floating point atoms may be disabled or placed in a low power state. In the FP32 numerical mode, the DSP slice 200 may perform floating-point operations including floating-point multiply-add, multiply-accumulate, independent multiply, and independent add operations. The floating-point multiply operations may be performed using multiplier 212, while the floating-point addition operations may be performed using separate logic (floating-point adder 233/floating-point adder atom 316). Note that logic may be present in multiplier 212 which is used for completing floating-point multiplication operations which is not used in the fixed-point numerical modes.

When the DSP slice is operating in the FP32 numerical mode, each floating-point input to the multiplier 212 may be in either the IEEE binary32 format (also called single precision, or FP32) or in the binary16 format (also called half-precision, or FP16). The format selected for each multiplier input may be signaled by one or more control attributes, such as an attribute A-FPTYPE corresponding to the selected format for the A input, or a B_D_FPTYPE corresponding to the selected format for the B or D input. In some implementations the output of multiplier 212 and floating-point adder 233 may be in the single precision format (FP32) regardless of whether the multiplier or adder inputs are in the single precision or half-precision formats. This means that the overflow condition may be determined based on the FP32 format's maximum value regardless of the format of the input.

In some implementations, the floating-point adder 233 may only accept single precision inputs (binary32/FP32). The floating-point adder 233 may include an internal loop-back path which may be used for accumulation functions (such as for operations such as floating-point cumulative summation operations). In some implementations, the output of the multiplier 212 may feed the floating-point adder 233 without additional fabric routing. This may be used to support operations such as multiply-add (MADD) or multiply-accumulate (MAC) operations. In some implementations, floating-point inputs may be cascaded, for example, using the ACIN and BCIN inputs, as discussed above. For example, the B cascade signal may be selected as one of the B input, the D input, or the BCIN input. Similarly, the A cascade signal may be selected as one of the A input or the ACIN input.

In some implementations, the DSP slice 200 may conform to a number of aspects of one or more technical standards when operating in the FP32 numerical mode. For example, the DSP slice 200 may conform to a number of aspects of the IEEE 754 standard for floating-point arithmetic, such as: support for FP32 formatted inputs for the multiplier 212 and the floating-point adder 233; support for FP16 formatted inputs for the multiplier 212; support for signaling NaN (not a number) and for quiet NaN (signaling NaN raises an invalid but while quiet NaN does not); sign handling for outputs of zero for the multiplier 212 and the floating-point adder 233; and some aspects of invalid operation handling which set an invalid status flag.

While operating in the FP32 numerical mode, some aspects of the DSP slice 200 may conform to the IEEE 754 standard, however, some other aspects of the DSP slice 200 may not conform. For example, some aspects of this non-conformance may be implemented for compatibility with the Intel streaming SIMD extensions (SSE) instruction set. More specifically, such nonconformance may be implemented to match the behavior of such an Intel SSE instruction set with respect to addition and multiplication with a flush to zero (FTZ) features and denormal as zero (DAZ) features. For example, the DSP slice 200 may treat denormal input as zero, meaning that input having an exponent of zero and a mantissa not equal to zero will be treated as zero. Additionally, if after normalization and rounding a number may not be represented using a normalized value, the output may be zero, and an underflow flag may be raised. Further, in some implementations in the FP32 numerical mode the DSP slice 200 may support rounding only to the nearest even number. In some implementations, a mantissa associated with a NaN input may not be propagated to the output of DSP slice 200.

Figure 6:
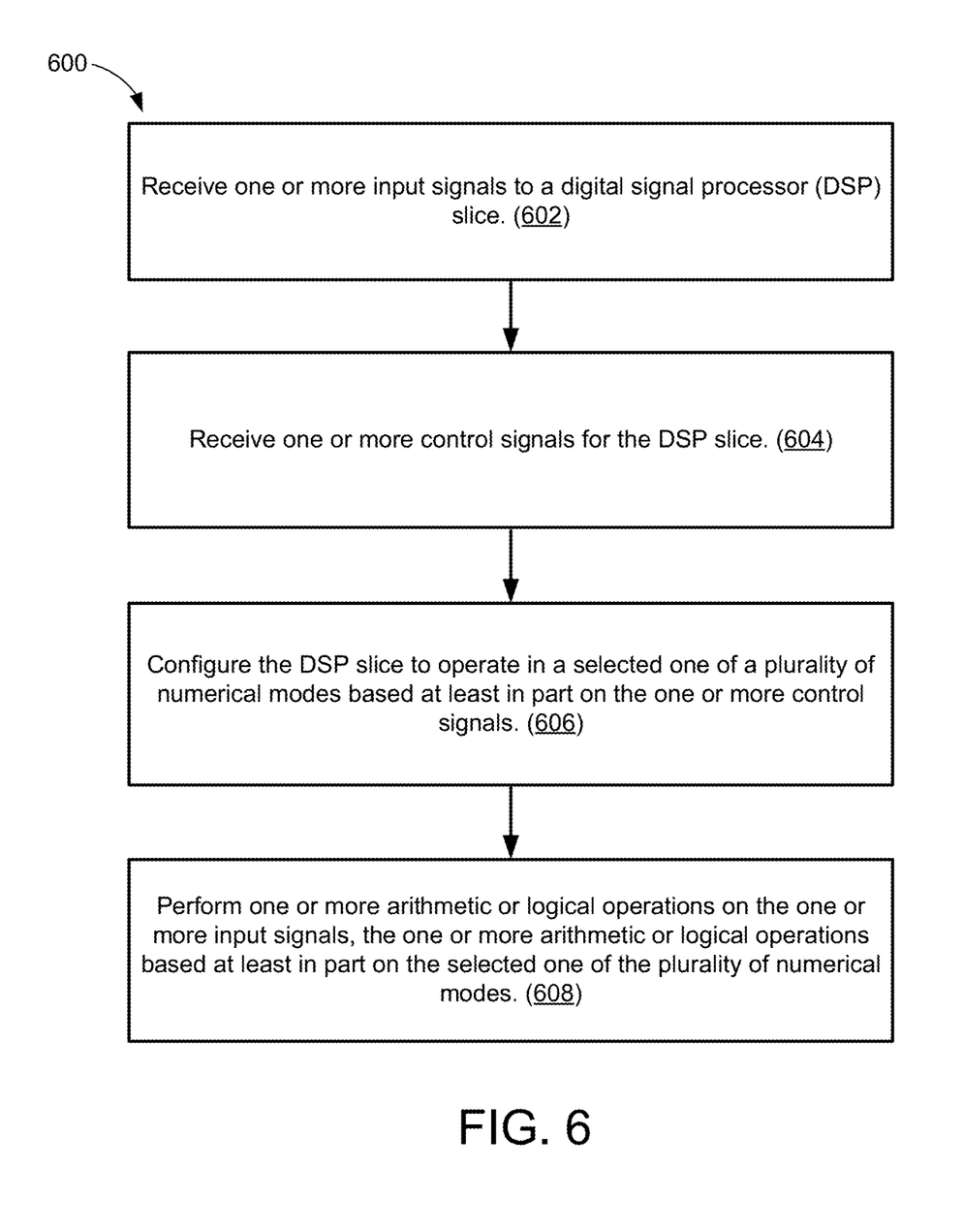
FIG. 6 is an illustrative flow chart depicting an example operation for selectably operating a DSP slice in one of a plurality of numerical modes, in accordance with some embodiments.

FIG. 6 is an illustrative flowchart of an operation 600 for selectably operating a DSP slice in a selected one of a plurality of numerical modes, according to some implementations. The operation 600 may be performed by a suitable DSP slice, such as DSP slice 200. Such a DSP slice may be one of a plurality of DSP slices incorporated into a suitable programmable device, such as an FPGA. With respect to FIG. 6, one or more input signals to the DSP slice may be received (602). For example, as discussed above, the one or more input signals may be one or more of the A, B, C, and D input signals, one or more of the carry input signals, one or more of the cascade input signals ACIN or BCIN, and so on. One or more control signals for the DSP slice may also be received (604). As discussed above, the one or more control signals may include one or more of the INMODE, NEGATE, OPMODE, CARRYINSEL, or ALUMODE control signals. Based at least in part on the one or more control signals, the DSP slice may be configured to operate in a selected one of the plurality of numerical modes (606). As discussed above, the numerical modes may include one or more fixed-point numerical modes, such as INT24, INT8, or CINT18 numerical modes, and one or more floating-point numerical modes, such as an FP32 numerical mode. Configuring the DSP slice to operate in the selected one of the plurality of numerical modes may include placing one or more modules of the DSP slice into a low power state when not needed for the selected numerical mode. For example, one or more modules used by the DSP slice for operating in a floating-point numerical mode may not be needed for one or more of the fixed-point numerical modes, and the floating-point modules may accordingly be placed in the low power state when the DSP slice is configured to operate in the one or more of the fixed-point numerical modes.

Figure 7:
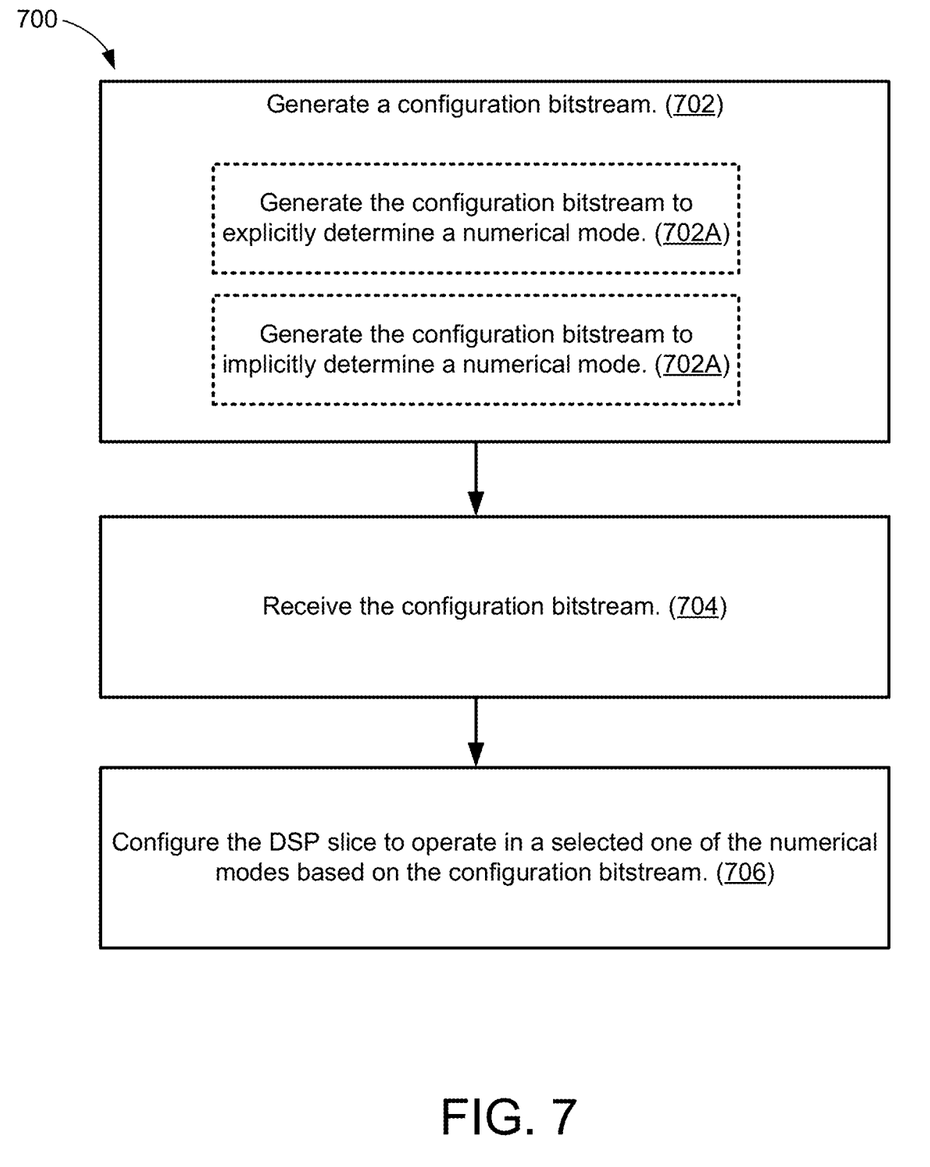
FIG. 7 is an illustrative flowchart of an operation for configuring a DSP slice to operate in a selected one of a plurality of numerical modes, according to some implementations.

FIG. 7 is an illustrative flowchart of an operation 700 for configuring a DSP slice to operate in a selected one of a plurality of numerical modes, according to some implementations. The operation 700 may be performed by a suitable DSP slice, such as DSP slice 200. Such a DSP slice may be one of a plurality of DSP slices incorporated into a suitable programmable device, such as an FPGA. With respect to FIG. 7, a configuration bitstream may be generated (702). As discussed above, in some implementations the configuration bitstream may be generated to explicitly determine the numerical mode the DSP slice is to operate in (702A), such as when a designer composes a representation (such as an HDL representation) where the DSP slice is to operate in the selected numerical mode. In some other implementations the configuration bitstream may be generated to implicitly determine the numerical mode the DSP slice is to operate in (702B). For example, in an example implicit determination, an EDA tool may infer that an intended operation or function to be performed may be achieved by configuring the example DSP slice to operate in a selected numerical mode.

The DSP slice may receive the generated configuration bitstream (704). For example, the configuration bitstream may be received as the contents of one or more configuration memory cells whose contents may be set by the configuration bitstream. Based on the received configuration bitstream, the DSP slice may then be configured to operate in the selected one of the numerical modes (706).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A digital signal processor (DSP) slice, comprising:
an input stage to receive a plurality of input signals;
a pre-adder coupled to the input stage, the pre-adder configured to perform one or more operations on one or more of the plurality of input signals;
a multiplier coupled to the input stage and the pre-adder, the multiplier configured to perform one or more multiplication operations on one or more of the plurality of input signals or an output of the pre-adder;
an arithmetic logic unit (ALU) coupled to the input stage, the pre-adder, and the multiplier, the ALU configured to perform one or more mathematical or logical operations on one or more of the plurality of input signals, the output of the pre-adder, or the output of the multiplier; and
an output stage coupled to the ALU, the output stage configured to generate one or more output signals based at least in part on one or more of the outputs of the ALU, or at least one of the plurality of input signals, wherein the DSP slice is configured to operate in a selected one of a plurality of numerical modes based on one or more bits of a configuration bitstream, the plurality of numerical modes including one or more fixed-point numerical modes and one or more floating-point numerical modes, and one or more modules associated with the one or more floating-point numerical modes are configured to be placed in a low power state when the DSP slice is configured to operate in one or more of the fixed-point numerical modes.

2. The DSP slice of claim 1, wherein the one or more fixed-point numerical modes include a 24-bit integer fixed-point (INT24) numerical mode.

3. The DSP slice of claim 2, wherein, in the INT24 numerical mode, the multiplier is configured to selectably negate an output of the multiplier based on a bit of a negate control signal.

4. The DSP slice of claim 2, wherein the one or more fixed-point numerical modes further include an 8-bit integer fixed-point (INT8) numerical mode.

5. The DSP slice of claim 4, wherein, in the INT8 numerical mode, the DSP slice is configured to perform a vector dot product between a first input signal of the plurality of input signals and a second input signal of the plurality of input signals.

6. The DSP slice of claim 5, wherein the first input signal includes three 9-bit fixed point numbers, the second input signal includes three 8-bit fixed point numbers, and the vector dot product is between the three 9-bit fixed point numbers and the three 8-bit fixed point numbers.

7. The DSP slice of claim 6, wherein the DSP slice is configured to selectably negate each partial product between the three 9-bit fixed point numbers and the three 8-bit fixed point numbers based at least in part on corresponding bits of a negate control signal.

8. The DSP slice of claim 1, wherein the one or more fixed-point modes includes an 18-bit complex fixed-point (CINT18) numerical mode, and wherein, in the CINT18 numerical mode, the DSP slice is configured to compute a complex product between a first complex number and a second complex number, the first and second complex numbers each having an 18-bit real component and an 18-bit imaginary component.

9. The DSP slice of claim 8, wherein, in the CINT18 numerical mode, the DSP is further configured to compute a complex conjugate product between the first complex number and the second complex number.

10. The DSP slice of claim 8, wherein, in the CINT18 numerical mode, the DSP slice is configured to be coupled to a second DSP slice to compute the complex product, wherein the DSP slice is configured to determine one of a real component and an imaginary component of the complex product, and the second DSP slice is configured to determine the other of the real component and the imaginary component.

11. The DSP slice of claim 10, wherein the DSP slice and the second DSP slice include common term logic, wherein, in the CINT numerical mode, the DSP slice and the second DSP slice are further configured to use the common term logic to determine a common term to each of the real component and the imaginary component.

12. The DSP slice of claim 1, wherein the one or more floating point numerical modes include a 32-bit floating-point (FP32) numerical mode.

13. The DSP slice of claim 12, wherein, in the FP32 numerical mode, the multiplier is configured to determine products between single-precision multiplier inputs and to determine products between half-precision multiplier inputs.

14. The DSP slice of claim 1, wherein, when the DSP slice is configured to operate in a selected one of the plurality of numerical modes, one or more modules of the DSP slice associated with a second one of the plurality of numerical modes are controlled to be in a low power state.

15. The DSP slice of claim 1, wherein the multiplier is configured to be placed in a low power state based at least in part on a multiplier use attribute.

16. A method for operating a digital signal processor (DSP) slice, comprising:
 receiving one or more input signals to the DSP slice;
 receiving one or more control signals for the DSP slice;
 configuring the DSP slice to operate in a selected one of a plurality of numerical modes based at least in part on the one or more control signals; and
 performing one or more arithmetic or logical operations on the one or more input signals, the one or more arithmetic or logic operations based at least in part on the selected one of the plurality of numerical modes, wherein the plurality of numerical modes includes one or more fixed-point numerical modes and one or more floating-point numerical modes, wherein one or more modules of the DSP slice associated with the one or more floating-point numerical modes are configured to be placed in a low power state when the DSP slice is configured to operate in one or more of the fixed-point numerical modes.

* * * * *